(12) United States Patent
Yudovsky et al.

(10) Patent No.: US 6,521,292 B1
(45) Date of Patent: Feb. 18, 2003

(54) SUBSTRATE SUPPORT INCLUDING PURGE RING HAVING INNER EDGE ALIGNED TO WAFER EDGE

(75) Inventors: Joseph Yudovsky, Campbell, CA (US); Salvador Umotoy, Antioch, CA (US); Thomas Madar, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 62 days.

(21) Appl. No.: 09/632,645

(22) Filed: Aug. 4, 2000

(51) Int. Cl.[7] .............................................. C23C 16/52
(52) U.S. Cl. ................... 427/248.1; 156/345; 118/720; 118/728; 118/729; 118/500; 118/504
(58) Field of Search ................................. 118/720, 728, 118/729, 500, 504; 156/345; 427/248.1

(56) References Cited

U.S. PATENT DOCUMENTS

| | | | |
|---|---|---|---|
| 5,230,741 A | 7/1993 | van de Ven et al. | 118/728 |
| 5,238,499 A | 8/1993 | van de Ven et al. | 118/724 |
| 5,374,594 A | 12/1994 | van de Ven et al. | 437/247 |
| 5,583,971 A | 12/1996 | Selbrede | |
| 5,766,365 A | 6/1998 | Umotoy et al. | 118/728 |
| 5,882,417 A * | 3/1999 | van de Ven et al. | 118/500 |
| 5,888,304 A * | 3/1999 | Umotoy et al. | 118/500 |
| 5,922,133 A * | 7/1999 | Tepman et al. | 118/503 |
| 6,040,011 A | 3/2000 | Yudovsky et al. | |
| 6,051,122 A | 4/2000 | Flanigan | |
| 6,223,447 B1 | 5/2001 | Yudovsky et al. | |

FOREIGN PATENT DOCUMENTS

| | | | |
|---|---|---|---|
| EP | 595054 | * | 5/1994 |
| EP | 698 673 A1 | | 2/1996 |
| EP | 1 004 688 A1 | | 5/2000 |
| WO | WO 98/53484 A1 | | 11/1998 |

* cited by examiner

*Primary Examiner*—Timothy Meeks
(74) *Attorney, Agent, or Firm*—Townsend and Townsend & Crew

(57) ABSTRACT

The present invention provides exemplary apparatus and methods for processing substrates and for ensuring purge gases reach the substrate edge, including edges of JMF type wafers, to help prevent unwanted deposition thereon. One embodiment provides an apparatus for processing substrates which includes a chamber and a substrate support (13) disposed in the chamber. An edge ring (15) is disposed on the substrate support. The edge ring has a lip portion (30) which at least partially overhangs an upper surface (36) of the substrate support to define a gap (29) between the lip portion and the upper surface. In this manner, the edge ring is designed to form a gap which properly directs purge gases to edges of the substrate, including JMF type substrates.

19 Claims, 8 Drawing Sheets

SUBSTRATE SUPPORT INCLUDING PURGE RING HAVING INNER EDGE ALIGNED TO WAFER EDGE

BACKGROUND OF THE INVENTION

The present invention relates to an improved susceptor which inhibits the deposition of process gasses on the edge and backside of a substrate, which may be more easily removed and cleaned, and which is adapted for use with JMF type wafers.

Chemical vapor deposition (CVD) is one of a number of processes used to deposit thin films of material on semiconductor substrates. To process substrates using CVD, a vacuum chamber is provided with a susceptor configured to receive a substrate. In a typical CVD chamber, the substrate is placed into and removed from the chamber by a robot blade and is supported by a substrate support during processing. A precursor gas is charged into the vacuum chamber through a gas manifold plate situated above the substrate, where the substrate is heated to process temperatures, generally in the range of about 250° to 650° C. The precursor gas reacts on the heated substrate surface to deposit a thin layer thereon and to form volatile byproduct gases, which are pumped away through the chamber exhaust system.

A primary goal of substrate processing is to obtain the largest useful surface area, and as a result the greatest number of chips, possible from each substrate. This is highlighted by the recent demands from semiconductor chip manufacturers to minimize edge exclusion on the substrates processed, so that as little of the substrate surface as possible, including portions near the edge of the wafer, is wasted. Some important factors to consider include processing variables that affect the uniformity and thickness of the layer deposited on the substrate, and contaminants that may attach to the substrate and render all or a portion of the substrate defective or useless. Both of these factors should be controlled to maximize the useful surface area for each substrate processed.

One source of particle contamination in the chamber is material deposited at the edge or on the backside of the substrate that flakes off or peels off during a subsequent process. Substrate edges are typically beveled, making deposition difficult to control over these surfaces. Thus, deposition at substrate edges is typically nonuniform and, where metal is deposited, tends to adhere differently to a dielectric than to silicon. If a wafer dielectric layer does not extend to the bevel, metal may be deposited on a silicon bevel and eventually chip or flake, generating unwanted particles in the chamber. Additionally, chemical mechanical polishing is often used to smooth the surface of a substrate coated with tungsten or other metals. The act of polishing may cause any deposits on the edge and backside surfaces to flake and generate unwanted particles.

A number of approaches have been employed to control the deposition on the edge of the substrate during processing. One approach employs a shadow ring which essentially masks a portion of the perimeter of the substrate from the process gasses. One disadvantage with the shadow ring approach is that, by masking a portion of the substrate perimeter, the shadow ring reduces the overall useful surface area of the substrate. This problem is made worse if the shadow ring is not accurately aligned with the substrate, and alignment can be difficult to achieve.

Another approach employs a purge ring near the edge of the substrate for delivering a purge gas along the substrate edge to prevent edge deposition. The purge gas limits or prevents the deposition gas from reaching the substrate edges and thus limits or prevents deposition on the wafer beveled edge.

A wafer typically sits radially inside the purge ring, with a gap therebetween. Conventionally, purge rings are made of aluminum and are welded to the substrate support in an effort to prevent the ring from deforming during processing. However, during the thermal cycling which occurs within a CVD processing chamber, the aluminum rings nonetheless deform, losing the integrity of their shape and therefore compromise their ability to keep particles from depositing on the substrate edge. This can change the size of the gap, leading to non-uniformity of deposition across the wafer edge. As the aluminum rings expand and contract, material thereon can flake, and create particles which can contaminate the wafer. Furthermore, deformation of the aluminum ring tip or edges can cause the wafer to break.

Further, in order for the rings to work effectively for shadowing and/or for purging, they must be frequently cleaned to remove deposition material which can alter the gap or flake off and contaminate the wafer. Such cleaning increases chamber downtime, reduces throughput and results in higher operating costs.

Some wafers have a small notch in an outer edge thereof which is used to properly align the wafer with the substrate support and purge ring. Recently, the use of JMF type wafers presents additional problems in delivering a purged gas to the edge of the entire wafer. JMF type wafers typically have a flattened side, whereby the radius of the wafer to that flattened side is a small amount less than the radius of the wafer to the non-flattened portions. As a result, the standard purge rings do not properly align with the flattened edge of these JMF type wafers. The resulting effect is that the purge gas does not reach the flattened wafer edge. Hence, unwanted deposition of materials can occur on and near the fattened edge of the wafer, including JMF type wafers.

Accordingly a need exists for an improved susceptor which can reliably prevent edge deposition for all wafers, including JMF wafers, and which can be easily cleaned.

SUMMARY OF THE INVENTION

The present invention provides exemplary apparatus and methods for processing substrates, and more specifically, for ensuring purge gases reach the substrate edge, including edges of JMF type wafers, to help prevent unwanted deposition thereon.

One embodiment of the present invention provides an apparatus for processing substrates. The apparatus includes a chamber and a substrate support disposed in the chamber. An edge ring is disposed on the substrate support. The edge ring has a lip portion which at least partially overhangs an upper surface of the substrate support to define a gap between the lip portion and the upper surface. In this manner, the edge ring is designed to form a gap which properly directs purge gases to edges of the substrate, including JMF type substrates.

In one embodiment, the apparatus includes a purge gas system coupled to the gap for transferring a purge gas through the gap and under the lip portion. The purge gas can be a wide variety of gases, including argon and other inert gases.

In another embodiment, the lip portion has a generally flat inner edge that is adapted to match a substrate profile, for example, a JMF type substrate. In one embodiment, the lip portion extends over the upper surface a prescribed distance from an edge of the substrate support. In one embodiment, the prescribed distance is between about 1.5 mm and about 3.0 mm, and in another embodiment is about 2.0 mm. It will be appreciated by those skilled in the art that the prescribed distance will vary depending in part upon the substrate size (e.g., 200 mm, 300 mm, and the like), and shape.

In alternative embodiments, the edge ring comprises aluminum nitride (AlN), a ceramic (e.g., $Al_2O_3$), and the like. Similarly, in alternative embodiments, the substrate support comprises a ceramic heater, an aluminum heater, and the like.

In another embodiment, an apparatus for processing substrates includes a chamber, a substrate support disposed in the chamber, a first edge ring, such as a purge gas ring, disposed on the substrate support, and a second edge ring, such as a shadow ring, for mating engagement with the first edge ring. The second edge ring has a lip portion which at least partially overhangs the substrate support upper surface to define a gap therebetween. Hence, in this embodiment, the second edge ring helps define the appropriate gap.

The present invention further provides methods for supporting a substrate in a chamber. One such method includes providing an apparatus for processing substrates as described above, positioning a substrate on the support, and flowing a purge gas into the gap between the edge ring lip portion and the support upper surface so that the purge gas impinges upon the substrate edge.

In one aspect, the method further includes positioning a second edge ring above the edge ring to further define the gap. In another aspect, the method includes depositing a material on the substrate upper surface, with the purge gas flowing to substantially prevent deposition of the material on the substrate edge. The depositing step may comprise a CVD process, a PVD process or the like for depositing a metal layer, a dielectric layer, or the like.

In one embodiment, the method includes positioning the substrate so that a generally flat portion of the substrate edge is aligned with the lip portion or with the lip portion inner edge. Such a method is useful, for example, for processing JMF type substrates or other substrates having a generally flat edge portion.

Other objects, features and advantages of the present invention will become more fully apparent from the following detailed description, the appended claims and the accompanying drawings.

DESCRIPTION OF THE SPECIFIC EMBODIMENTS

Figure 1:
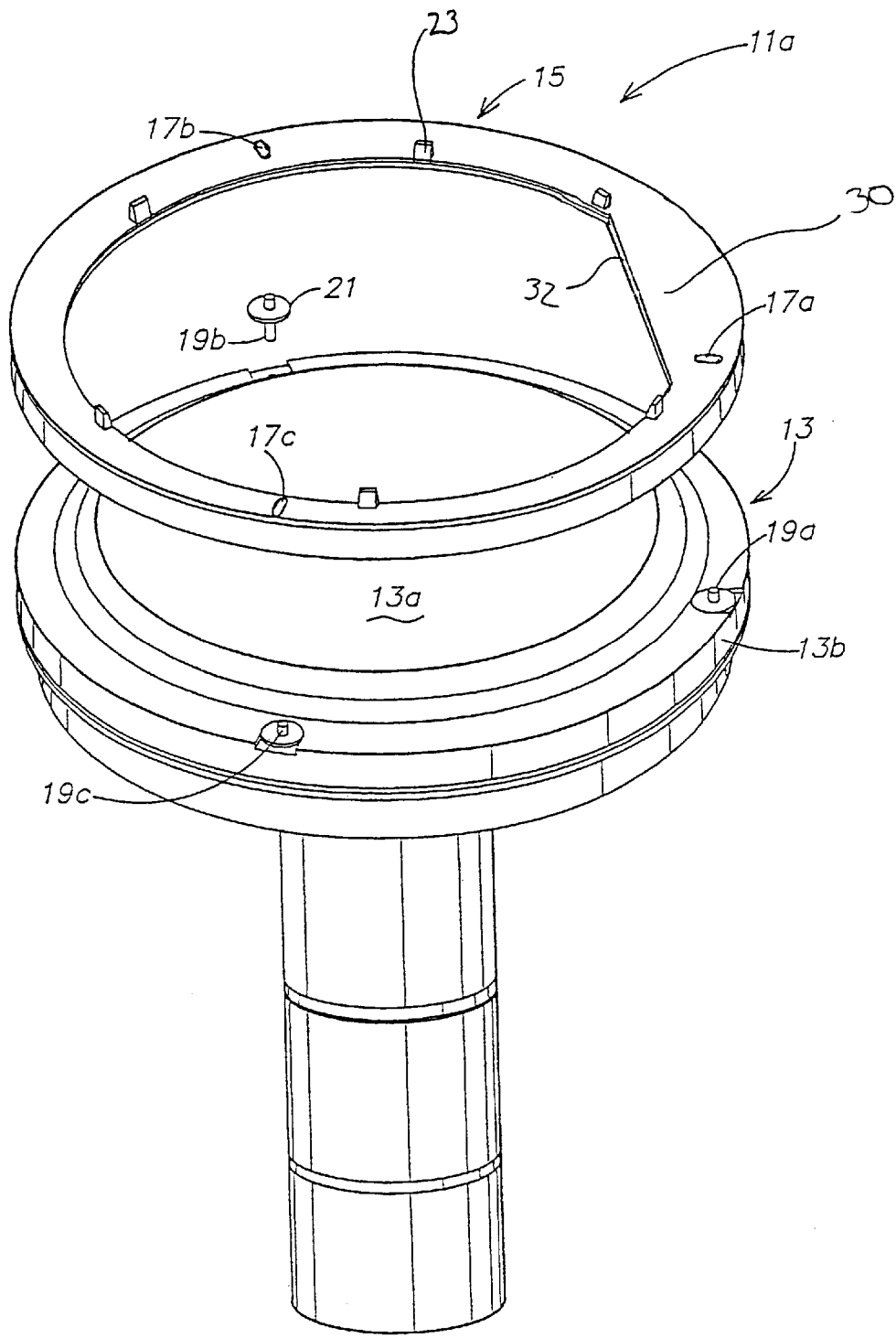
FIG. 1 is an exploded perspective view of a susceptor of the present invention.

FIG. 1 is an exploded perspective view of a susceptor 11a according to the present invention. Susceptor 11a includes a substrate support 13, adapted for pin and slot coupling with an edge ring, such as a purge ring 15. Specifically, substrate support 13 comprises three pins 19a–c which extend upwardly from the top surface of substrate support 13. The bottom surface of purge ring 15 comprises three alignment slots 17a–c positioned to interface with the three pins 19a–c. It will be appreciated by those skilled in the art that a larger or smaller number of pins and slots may be used. Substrate support 13 comprises a central wafer supporting surface 13a, and pins 19a–c are disposed substantially equally spaced around the substrate supporting surface 13a. Each of the slots 17a–c is at least as wide as the corresponding pin 19a–c, and extends radially outward from the center of the substrate supporting surface 13a, in the direction in which the substrate support 13 expands and contracts during thermal cycling.

Substrate support 13 is made of a metal such as aluminum in one embodiment. In another embodiment described in conjunction with FIGS. 7 and 8, support 13 is a ceramic support. Purge ring 15 is generally made of a material having a lower coefficient of thermal expansion (CTE) than the CTE of the substrate support 13 material. In one embodiment purge ring 15 is made of a ceramic material, such as $Al_2O_3$ and the like. In one embodiment, purge ring 15 comprises aluminum nitride (AlN).

Slots 17a–c extend a length which is sufficient to compensate for the difference in thermal expansion between substrate support 13 and purge ring 15, over the range of process temperatures to which susceptor 11a is exposed. This difference in thermal expansion may be due to the different CTE of the purge ring 15 material and the substrate support 13 material. Preferably each pin 19a–c is surrounded by a pad 21 made of a thermally insulating material, so as to achieve thermal insulation between substrate support 13 and purge ring 15. Pads 21 are preferably made of a highly polished ceramic and therefore allow purge ring 15 to slide easily therealong while minimizing particle generation. Purge ring 15 may further include a plurality of wafer guide pins 23 to facilitate accurate wafer placement.

Figure 3:
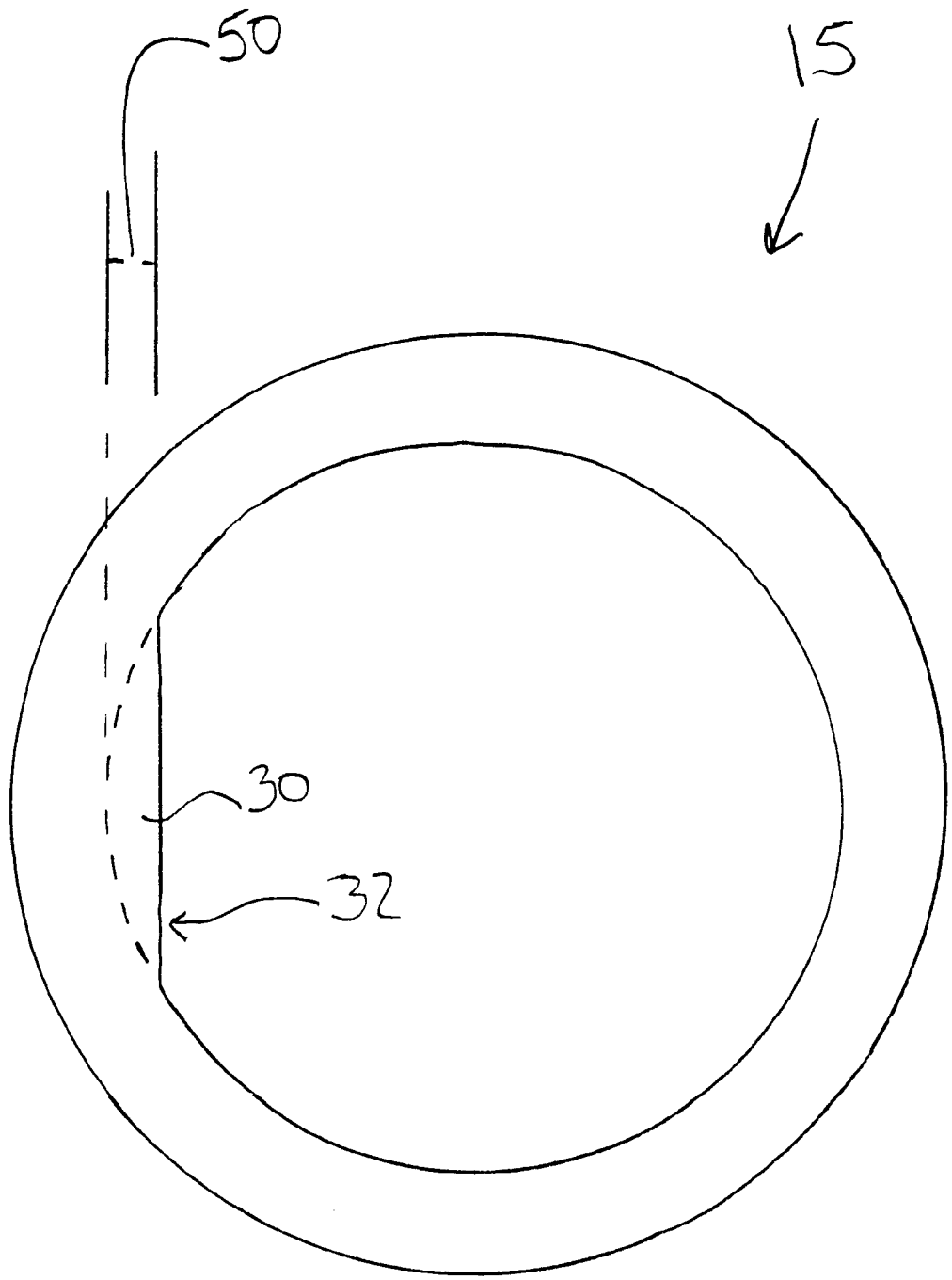
FIG. 3 is a simplified top view of a purge gas ring according to the present invention.

Purge ring 15 has a lip portion 30 having a generally flat inner edge 32. Lip portion 30 is configured to overhang a portion of supporting surface 13a to properly direct purge gases to a substrate edge during processing as further described below. Lip portion 30 will find particular use in conjunction with JMF type substrates which have a similar generally flat outer edge portion. It will be appreciated by those skilled in the art that the size of lip portion 30 may vary, depending in part upon the size of the flattened wafer edge portion. In one embodiment, inner edge 32 extends over an edge of the substrate support 13 by a prescribed distance 50 as shown in FIG. 3. In one embodiment, the prescribed distance is between about 1.5 mm and about 3.0 mm, and in another embodiment is about 2.0 mm. It will be appreciated by those skilled in the art that the overhang distance will vary depending in part upon the substrate size (e.g., 200 mm, 300 mm, and the like) and shape. In an alternative embodiment, the prescribed distance is calculated as the amount lip portion 30 extends inward from the inner diameter of purge ring 15. Such an embodiment permits calculation of the proper prescribed distance during purge ring 15 formation, as opposed to the distance as measured when purge ring 15 is disposed on support 13. In either embodiment, lip portion 30 inner edge 32 is positioned to direct purge gases to the substrate edge.

Figure 2:
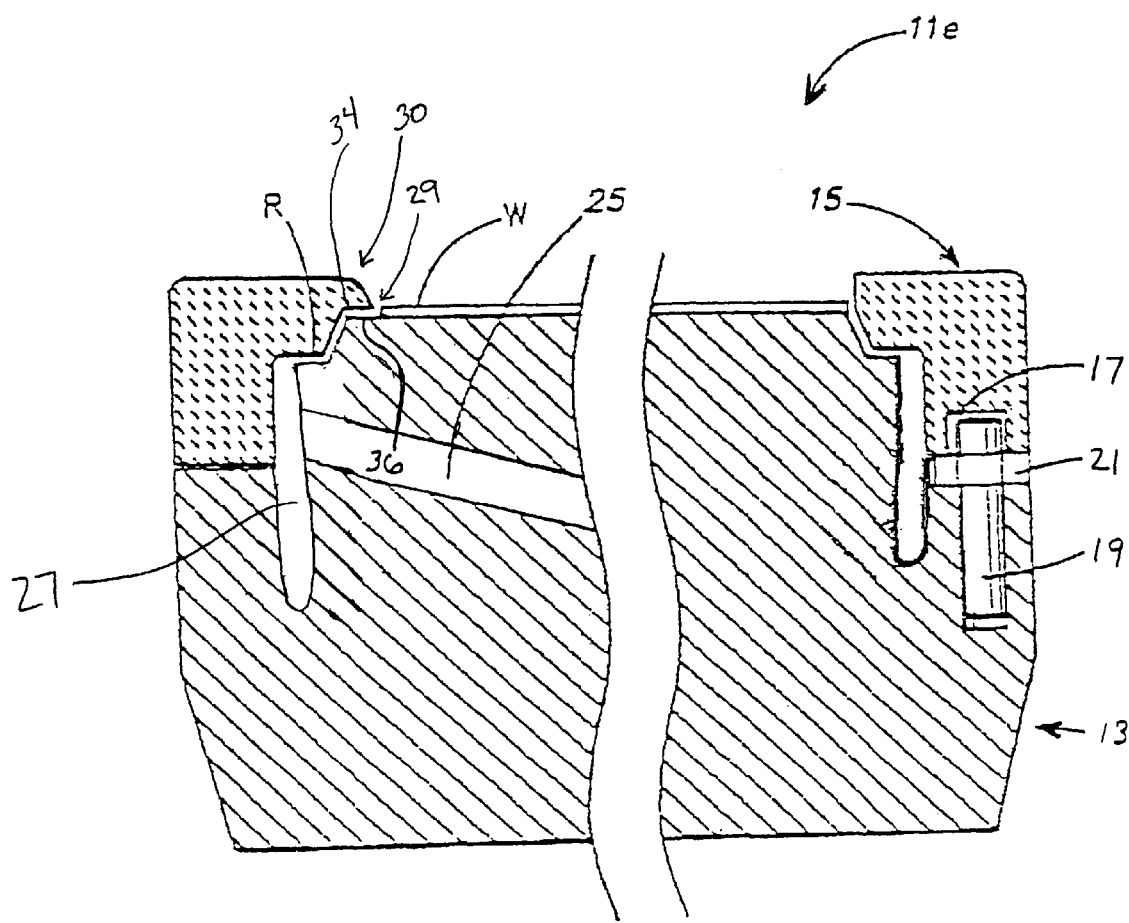
FIG. 2 is a side view in pertinent part of a susceptor of the present invention.

FIG. 2 is a side view, in pertinent part, of a susceptor 11e having a wafer W positioned thereon. As shown in FIG. 2, substrate support 13, purge ring 15 and slots 17 are configured such that with use of pad 21, no direct contact exists between substrate support 13 and purge ring 15. By thermally insulating purge ring 15 from the substrate support 13, purge ring 15 experiences less thermal stress than would otherwise result if purge ring 15 were to directly contact the typically higher temperature substrate support 13. Also as shown in FIG. 2, slot 17 has a depth greater than the length of pin 19 to reduce thermal conduction from the substrate support 13 to purge ring 15, via pin 19.

Slots 17*a–c* extend radially outward relative to the center of substrate support 13 and preferably are each just slightly wider than the respective pin 19*a–c*. This prevents purge ring 15 movement laterally relative to the substrate support occurring as a result of thermal cycling induced expansion and contraction from being more than the maximum distance allowing clearance between slot 17 and pin 19 pair. Pins 19*a–c* also restrict rotational movement of purge ring 15 relative to substrate support 13, thereby providing rotational alignment.

The substrate support 13 includes a purge gas delivery channel 25 and a purge gas distribution channel 27 to deliver purge gases to an edge of wafer W. Purge gas delivery channel 25 is coupled to a purge gas system, including a purge gas source. A wide variety of purge gases may be used, including argon (Ar) and other inerts, or noninerts.

In operation the wafer W is positioned on wafer support surface 13 such that the edge of the wafer W is positioned adjacent the outlet of a purge slot or gap 29. As previously noted, purge ring 15 includes lip portion 30 having generally flat inner edge 32. For wafers W, which include JMF type wafers and other wafers having a generally flat edge portion, the wafer W is positioned such that the generally flat edge of the wafer is aligned with lip portion 30, or inner edge 32. In this manner, the relationship between gap 29 and the outer edge of wafer W can be maintained so that purge gases reach the entire wafer edge. As shown in FIG. 2, lip portion 30 creates gap 29 between lip portion 30, and more specifically an underlying surface 34 of lip portion 30, and an upper surface 36 of substrate support 13. In this manner, as purge gas flows upwardly through gap 29 along the edge of the wafer W, deposition on the wafer edge is prevented. During a deposition process, the susceptor is typically heated, for example, to a temperature in the range of 350° to 475° C., typically by a heating coil embedded in or contacted with the underside of, susceptor 11*e*. However, for chamber maintenance or cleaning, susceptor 11*e* is typically allowed to cool back to ambient temperatures.

This temperature change causes thermal expansion and contraction of the chamber elements, including substrate support 13 and purge ring 15. Despite thermal cycling which occurs during CVD processing, and the resulting expansion and contraction of the substrate support 13, thermally induced stresses are not imposed upon purge ring 15, as it (and the pins 19*a–c* supporting it) can move radially as the temperature changes, due to the pin 19*a–c* and slot 17*a–c* coupling. Any thermally induced expansion of the gap between purge ring 15 and wafer W is generally insignificant. Accordingly edge deposition is more uniformly and reliably prevented. Moreover, purge ring 15 may be easily lifted off the pins 19*a–c* for routine cleaning or replacement. Accordingly downtime is minimized.

Susceptor 11*e* is configured to facilitate access to a purge gas distribution channel 25 for cleaning. Specifically, the surface of substrate support 13 in which pin 19 (or in an alternative embodiment, slot 17) is located, is below the outlet of purge gas distribution channel 25. Thus, when purge ring 15 and/or a shadow ring is removed from substrate support 13, the gas distribution channel outlet is exposed. To further facilitate cleaning, the purge gas distribution channel 25 may be angled upwardly (preferably between 0° and 30°), as shown in FIG. 2. Hence, removable purge ring 15 provides greater access and ease of cleaning of susceptor 11*e*, including grooves and holes therein.

Figure 4:
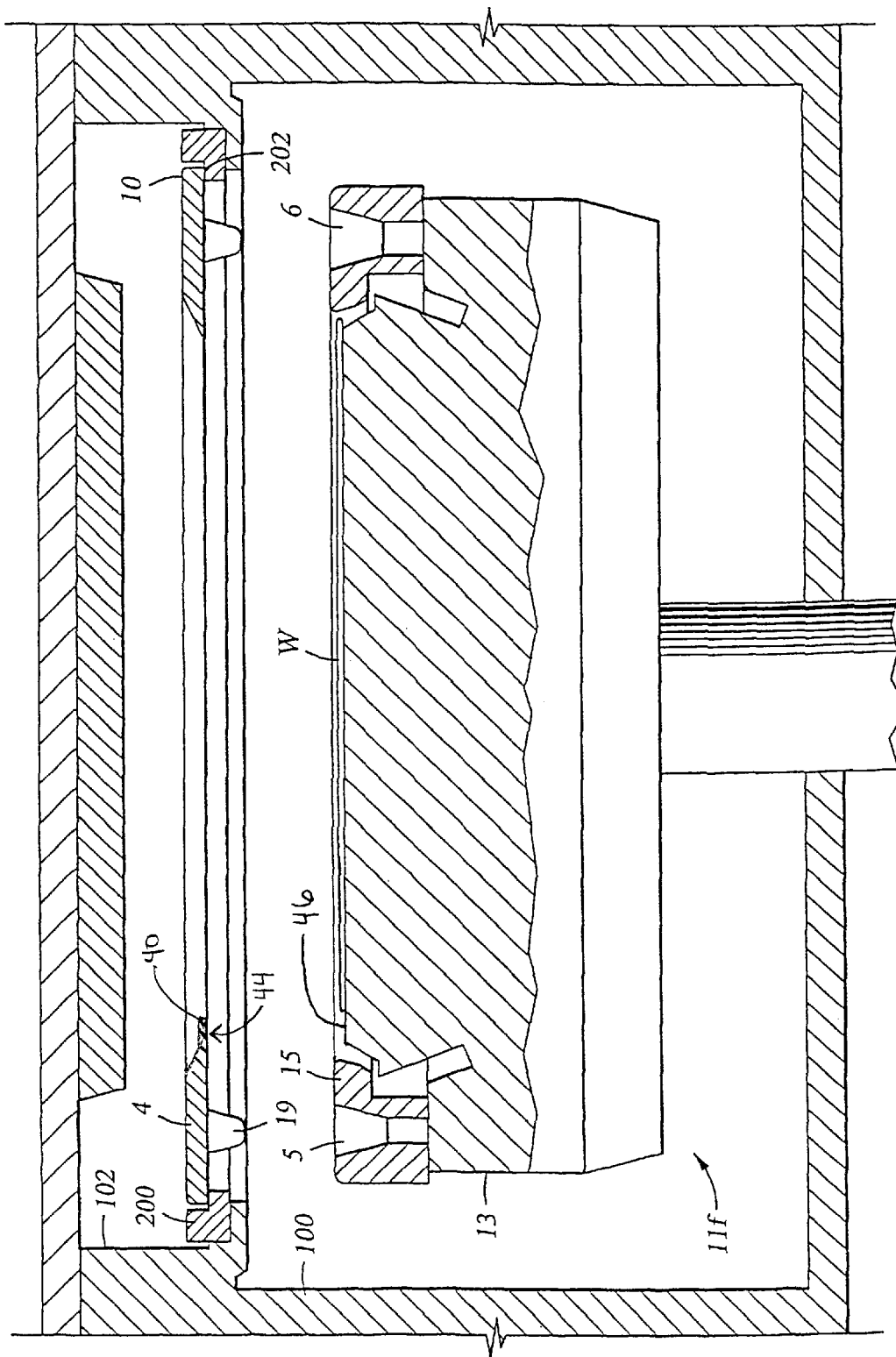
FIG. 4 is a side view of a chamber showing a susceptor of the present invention in a non-processing position.

FIG. 4 is a side view of a chamber showing an alternative embodiment of a susceptor 11*f* of the present invention in a lowered non-processing position. Susceptor 11*f* comprises a first ring, such as purge ring 15, disposed on substrate support 13, and a removable second edge ring, such as a shadow ring 4, supported by a chamber body ring 200 disposed on the internal surface 102 of the processing chamber body 100 above the substrate support 13. Purge ring 15 may be attached to substrate support 13 as described above. The substrate support may be made of various materials, such as aluminum and ceramic, and may include a heating element, such as a resistive heating coil. Shadow ring 4 comprises a plurality of tapered or frustoconically shaped pins 19 (two shown), generally equally spaced around the perimeter of shadow ring 4 and extending downwardly therefrom. The purge ring 15 includes at least one tapered or frustoconically shaped alignment recess 5 and at least one tapered or frustoconically shaped alignment slot 6 formed therein. Although the apparatus is shown and described with a shadow ring having pins thereon and a purge ring having recess/slot thereon, it is understood that additional embodiments are included wherein the pin and recess/slot coupling may be disposed on either the shadow ring or the purge ring. The invention also contemplates embodiments wherein either the pins or the recesses/slots include tapered surfaces.

Figure 5:
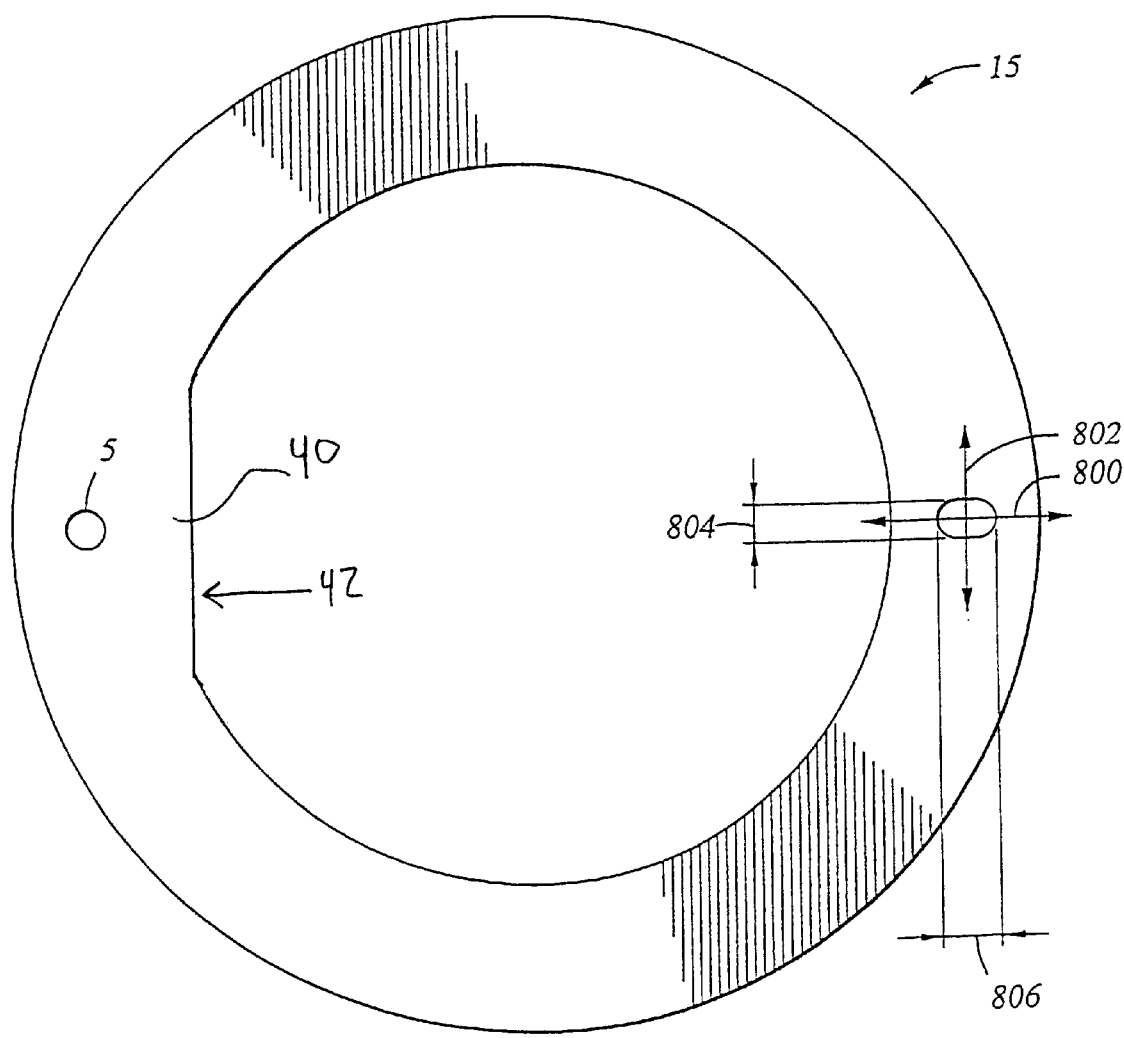
FIG. 5 is a top view of a shadow ring of the present invention.

Pins 19 are positioned to interface with alignment recess 5 and alignment slot 6. Alignment recess 5 and alignment slot 6 are at least as wide as a corresponding one of the plurality of pins 19. In one aspect, the width is defined as the dimension perpendicular to the radial direction, relative to the center of purge ring 15. Referring to FIG. 5 which is a top view of purge ring 15 of the invention showing the alignment recess 5 and alignment slot 6, line 800 represents the radial direction relative to the center of purge ring 15, and line 802 represents the direction perpendicular to the radial direction relative to the center of purge ring 15. The width of alignment slot 6, being the dimension perpendicular to the radial direction relative to the center of purge ring 15, is shown by segment 804. The radial dimension of alignment slot 6 is shown by segment 806. Alignment slot 6 extends in a radial direction, relative to the center of purge ring 15, a length that is sufficient to compensate for any difference in thermal expansion between purge ring 15 and shadow ring 4. The radial dimension (i.e., length) of alignment slot 6 is up to about sixty mils greater, preferably up to about forty mils greater, than the radial dimension of the corresponding pin 19. The width of alignment recess 5 and alignment slot 6 is between about three mils and about ten mils wider, preferably between about three mils and about eight mils wider, than the width of the corresponding pin 19. The coupling of pins 19 with alignment recess 5 and alignment slot 6 restricts movement of shadow ring 4 caused by thermal cycling induced expansion and contraction or other causes to less than the length of alignment slot 6. Pins 19 also restrict rotational movement of shadow ring 4 relative to purge ring 15, thereby providing rotational alignment.

Pins 19 as shown in FIG. 4 preferably have a frustoconical shape, tapering from a base portion to a top portion. Alignment recess 5 and alignment slot 6 have matching tapering sidewalls forming a wider opening portion and a narrower bottom portion for receiving tapered pins 19. This configuration allows for and corrects gross misalignment between the two rings because the narrower tip portion of pins 19 can be inserted into the wider opening portion of recess 5 and slot 6 with a greater margin of misalignment. Thus, with frustroconically shaped or tapered pins 19 instead of non-tapering (i.e., cylindrical) pins, recess 5, and slot 6, misalignment of shadow ring 4 with purge ring 15, due to thermal expansion or other causes can be corrected when pins 19 are inserted into recess 5 and slot 6 when the rings come together. As pins 19 are inserted into recess 5 and slot 6, misalignment between shadow ring 4 and purge ring 15 is corrected as the surface of pin 19 slides along the surface defined by recess 5 or slot 6. The two rings are aligned as pins 19 are fully inserted into recess 5 and slot 6.

The pin 19 and recess 5/slot 6 coupling allows shadow ring 4 to move with respect to purge ring 15 due to different thermal expansions between the two rings without imposing stresses on either ring that could cause ring deformation, flaking or breakage of any of the components. Shadow ring 4 remains in pivotal alignment to purge ring 15 at the location of the pin 19 and recess 5 coupling, while the pin 19 and slot 6 coupling allows the shadow ring to move slightly (i.e., restricted by the length of the slot 6) relative to each other due to different thermal expansions between the two rings. Consistent alignment of shadow ring 4 with purge ring 15 and the substrate is achieved. Moreover, shadow ring 4 may be easily removed for cleaning or replacement. Down time is thereby minimized.

Figure 6:
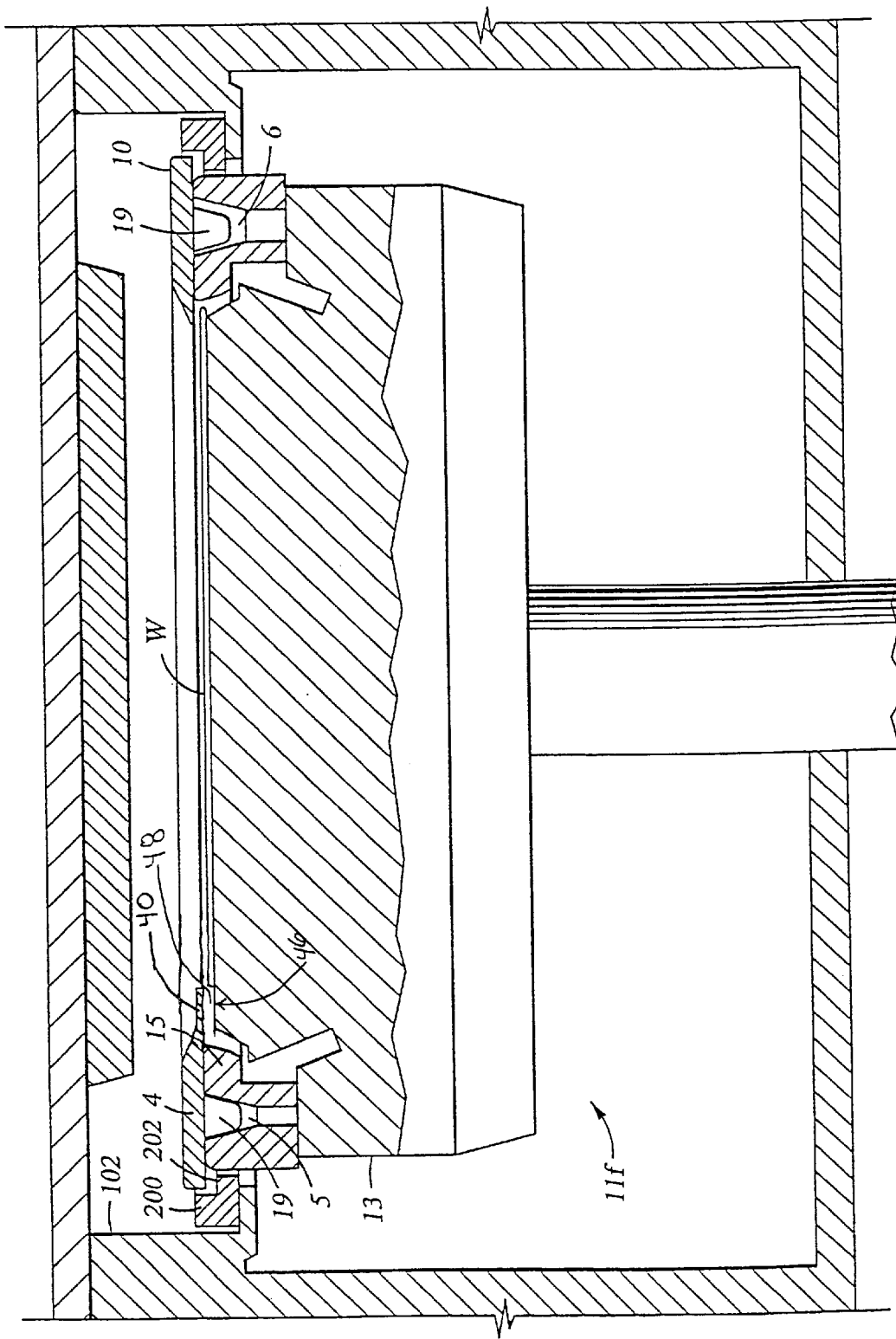
FIG. 6 is a side view of a chamber showing a susceptor of the present invention in a processing position.

FIG. 6 is a side view of a chamber showing a susceptor 11f in a processing position. As shown, purge ring 15 attached to substrate support 13 contacts and lifts shadow ring 4. Pins 19 of shadow ring 4 are inserted into recess 5 and slot 6 of purge ring 15. Shadow ring 4 is thereby lifted off the chamber body ring 200, so that the projections 10 of shadow ring 4 are lifted off the internal surface of the chamber body ring 200 defined by the recesses 202. In this configuration, shadow ring 4 is positioned about 3 to 5 millimeters above a wafer W and overhangs a portion of the perimeter, or edge, of the wafer W, preventing deposition thereon during CVD processing.

As shown in the embodiment described FIGS. 4–6, shadow ring 4 includes a lip portion 40 which has a generally flat inner edge 42. As previously described in conjunction with FIGS. 1–3, lip portion 40 is configured to more accurately match a substrate profile, such as a JMF type substrate, having a generally flat outer edge portion. In this embodiment, shadow ring 4 has lip portion 40 instead of purge ring 15. Alternatively, both purge ring 15 and shadow ring 4 have lip portions 30, 40. When shadow ring 4 is positioned in the substrate processing position as shown in FIG. 6, lip portion 40 defines a gap 48 between an underlying surface 44 of lip portion 40 and an upper surface 46 of substrate support 13. As a result, gap 48 is configured to direct purge gases to an edge of wafer W, notwithstanding that a portion of the wafer outer edge is generally flat.

In operation, substrate support 13 is initially lowered to a wafer transfer position as shown in FIG. 4. A wafer handler comprising a robot blade then carries a wafer into position above substrate support 13. Lift pins (not shown) lift the wafer W off the robot blade, and the robot blade retracts. Substrate support 13 is elevated to position the substrate thereon, and then substrate support 13 further elevates so that purge ring 15 attached thereto lifts shadow ring 4 off chamber body ring 200, as shown in FIG. 6. As purge ring 15 engages shadow ring 4, pins 19 are inserted into alignment recess 5 and alignment slot 6. The tapered surfaces of pins 19 slides along the tapered surfaces of alignment recess 5 and alignment slot 6, urging shadow ring 4 into desired alignment with purge ring 15.

Methods of the present invention include methods for supporting a substrate in a chamber. One particular method includes providing an apparatus as previously described in conjunction with FIGS. 1–3 or 4–6, and positioning a substrate on support 13. A purge gas is flowed into gap 29 or gap 48 between lip portion 30, 40 and the substrate support upper surface 36, 46. Gaps 29, 48 are configured such that purge gas impinges upon an edge of wafer W. Lip portion 30, 40 operates to direct purge gas to the entire wafer W edge, even for JMF type wafers or other wafers having a generally flat outer edge portion. Further, the positioning of wafer W is preferably accomplished by aligning the generally flat wafer edge portion with lip portion 30, 40 or lip portion inner edge 32, 42. Such a configuration preferably substantially prevents deposition of material, including metal or dielectric material, on a substrate or wafer edge.

As is apparent from the above description, a chamber such as the chamber described in commonly assigned U.S. patent application Ser. No. 09/103,462, filed Jun. 24, 1998 (incorporated herein by reference), when employing the susceptor described above, provides superior edge deposition prevention and increased throughput as compared to conventional deposition chambers (CVD, PVD, etc.).

Figure 7:
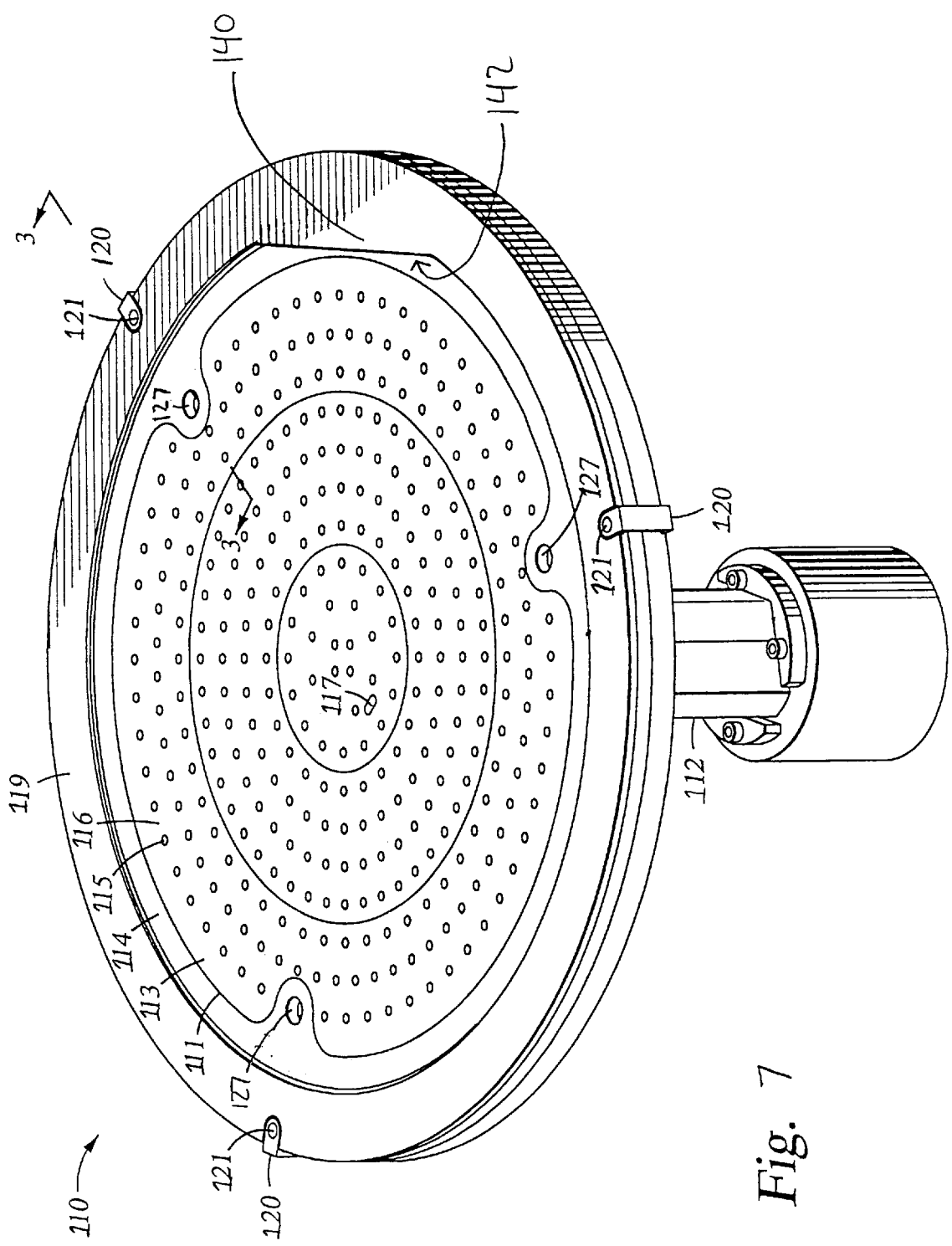
FIG. 7 is a perspective view of an alternative embodiment of the present invention.
Figure 8:
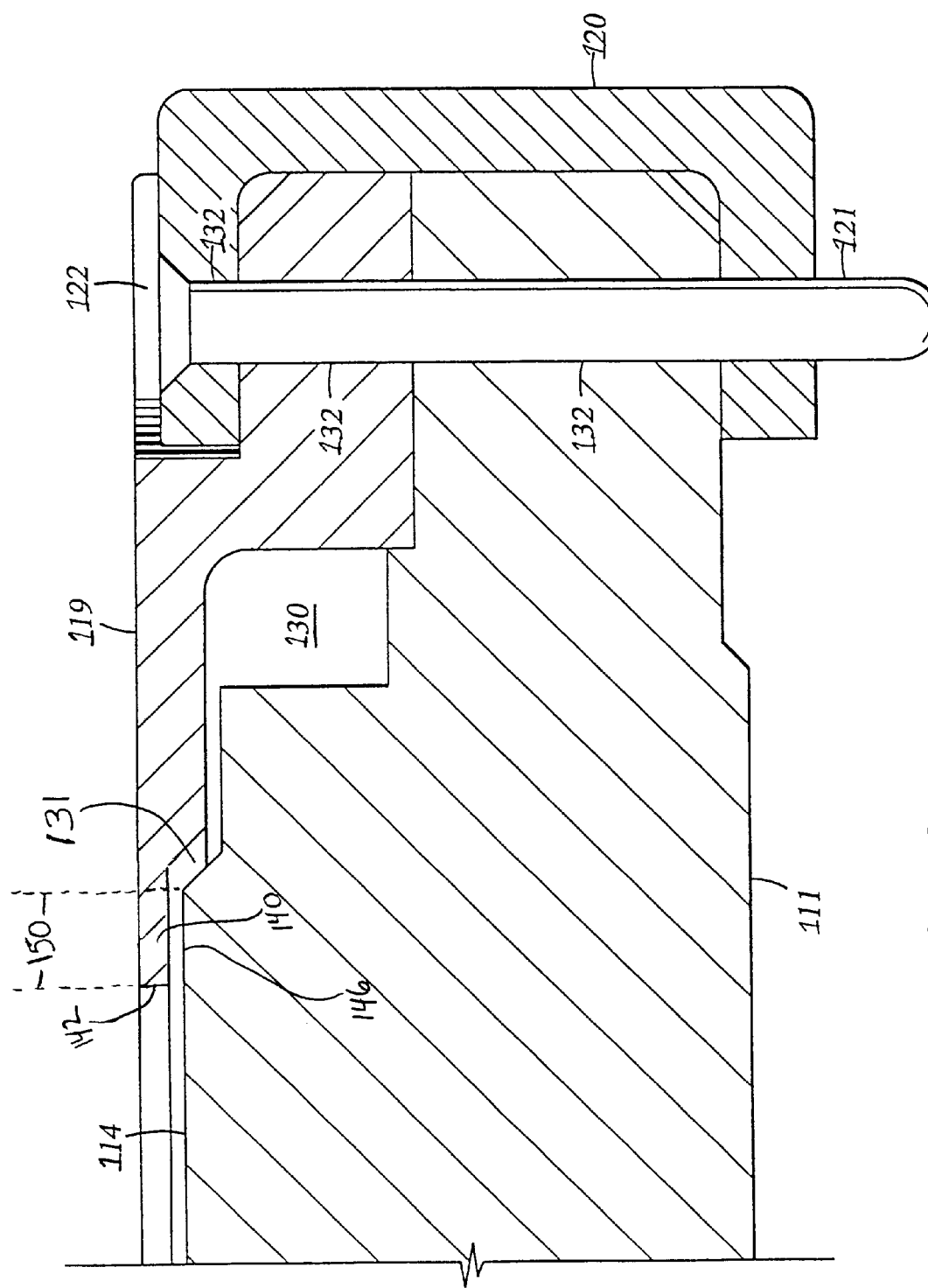
FIG. 8 is a side cross-sectional view of the embodiment shown in FIG. 7.

FIGS. 7 and 8 illustrate another embodiment of the present invention. As shown in FIG. 7, the substrate support comprises a heater pedestal 110 having a main body 111 supported on a vertically movable stem 112. Main body 111 has an upper face 113 defining a substrate supporting surface 114. To facilitate heat transfer between upper face 113 of the heater pedestal 110 and the substrate, the substrate is preferably chucked, or adhered, to upper face 113 using a vacuum. Generally, to accomplish the distribution of the vacuum, upper face 113 of heater pedestal 110 includes a number of raised areas 115 adapted to support a substrate thereon and a number of recessed areas 116 adapted to support a low pressure region via fluid communication with a vacuum supply from a vacuum introduced through a vacuum port 117. Heater pedestal 110 may further include recesses 127 in which lift pins (not shown) move vertically under action of a motion actuating assembly (not shown) to lift the substrate clear of upper face 113 of heater pedestal 110. A purge ring member 119 is positioned on heater pedestal 110 and adjacent to the periphery of the substrate supporting surface 114. Purge member 119 includes a lip or overhang portion 140 having a generally flat inner edge 142. Lip portion 140 is similar to lip portions 30 and 40 described in conjunction with earlier figures. More specifically, lip portion 140 is configured to more accurately conform with the outer dimensions of an underlying substrate, such as a JMF type substrate, having a generally flat outer edge portion. The purge gas channel formed by purge member 119 is further discussed below.

A fastening device, which in one embodiment comprises a C-clamp 120, is releasably positioned over purge member 119 and main body 111 of heater pedestal 110 to prevent vertical displacement of purge member 119. A pin 121 is releasably inserted into clamp 120, purge member 119, and main body 111 to releasably secure clamp 120 on the support member. Pin 121 allows easy removal of clamp 120 and purge member 119 which facilitates cleaning or replacement of purge member 119 and heater pedestal 110 and thereby increases the productivity of the system. Furthermore, the use of clamp 120 and pin 121 with ceramic components reduces the likelihood of damage to heater pedestal 110 and purge member 119. In one embodiment, purge member 119 is secured to main body 111 using three clamps 120 and three pins 121. In addition, a slot 122 can be formed in purge member 119 for the placement of clamp 120. Slot 122 enables alignment of clamp 120 and further prevents rotational displacement of purge member 119 relative to the support member.

FIG. 8 is a cross-sectional view of the edge of heater pedestal 110. Purge member 119 and main body 111 of heater pedestal 110 form a plenum 130 which directs a purge gas through an exit gap 131 to the perimeter portion of the substrate supporting surface 114. Main body 111, purge member 119, and clamp 120 have a bore 132 formed therein to releasably receive pin 121, which prevents rotational displacement of purge member 119 and prevents purge member 119 from moving or vertically displacing when plenum 130 is pressurized. A slot 122 can be formed in purge member 119 for the placement of clamp 120. Alternatively, slots can also be formed in both main body 111 and purge member 119 or only in main body 111 to further assist alignment and prevent rotation of purge member 119. As shown, lip portion 140 overhangs a portion of an upper surface 146 of supporting surface 114. In one embodiment lip portion 140 overhangs upper surface 146 by a prescribed distance 150 that is between about 1.5 mm and about 3.0 mm, and in another embodiment is about 2.0 mm. As a result, exit gap 131 is extended over upper surface 146 to further direct purge gases to a generally flat edge portion of a substrate or a wafer positioned on surface 114. Again, preferably wafer W is positioned such that a generally flat edge portion of the wafer is generally aligned with lip portion 140 or inner edge 142.

Heater pedestal 110, purge member 119, clamp 120, and pin 121 are preferably made of ceramic materials such as alumina or aluminum nitride. The above components need not be made of the same ceramic material but should be made of ceramic materials with similar rates of thermal expansion. Ceramic materials are well suited for use at high temperatures. Some of the problems with the conventional use of aluminum materials in CVD systems are aluminum corrosion, temperature limitations, and unwanted deposition. Plasma gas may cause aluminum corrosion which leads to processing degradation relating to metal contamination in the devices. Further, at temperatures greater than about 480° C., aluminum experiences softening, possibly resulting in warpage. When aluminum is used above about 480° C. in the presence of a plasma, the aluminum may backsputter contaminating the substrate and chamber components. Thus, one application the present invention is ideally suited for is plasma-enhanced CVD of tungsten or other metals at high temperatures, as well as remote plasma clean process applications.

Modifications of the above disclosed apparatus and methods fall within the scope of the invention and will be readily apparent to those of ordinary skill in the art. For instance, the susceptor comprises pin and slot coupling between any type of edge ring (purge ring and/or shadow ring), whether the pins are located on the substrate support or the ring. Although the figures show the use of thermally insulating pads, these pads are optional. Further, it will be understood that a heating element may be included in the susceptor. Also, each of the purge gas delivery channels 25 of the various embodiments of the invention preferably open into a purge gas distribution channel 27 which also extends somewhat below the opening of the purge gas delivery channel 25, so as to create a buffer channel which ensures more even distribution of the purge gas to the purge slots 29. Lip portions 30, 40 and 140 may have a different shape or size than depicted in the figures to accommodate different substrate types and sizes.

The terms pin and slot are to be broadly interpreted to include shapes other than straight pins and slots 6 (e.g., rectangular keys, etc.). Further, purge ring or purge ring/shadow ring can be advantageously removably coupled to a substrate support, by mechanisms other than pin and slot coupling. Any removably coupled purge ring will benefit from the exposed outlet of the purge gas delivery channel and the upwardly angled purge gas delivery channel.

While the present invention has been disclosed in connection with the preferred embodiments thereof, it should be understood that other embodiments may fall within the spirit and scope of the invention, as defined by the following claims.

What is claimed is:

1. An apparatus for processing substrates, comprising:
   a chamber;
   a substrate support disposed in said chamber, said substrate support having an upper surface; and
   an edge ring disposed on said substrate support, said edge ring having a lip portion which at least partially overhangs said substrate support upper surface to define a gap between said lip portion and said upper surface, an inner edge of the lip aligned with an edge of a substrate positioned on the upper surface, such that the lip edge does not overlap a front surface of the substrate.

2. The apparatus of claim 1 further comprising a purge gas system coupled to said gap for transferring a purge gas through said gap and under said lip portion.

3. The apparatus of claim 1 wherein said lip portion has a generally flat inner edge that is adapted to match a substrate profile.

4. The apparatus of claim 3 wherein said substrate is a JMF type substrate.

5. The apparatus of claim 1 wherein said edge ring comprises aluminum nitride.

6. The apparatus of claim 1 wherein said edge ring comprises a ceramic.

7. The apparatus of claim 1 wherein said substrate support comprises a ceramic.

8. The apparatus of claim 1 wherein said substrate support comprises aluminum.

9. The apparatus of claim 1 wherein said lip portion extends over said upper surface a prescribed distance from an edge of said substrate support, said distance between about 1.5 mm and about 3.0 mm.

10. An apparatus for processing substrates, comprising:
    a chamber;
    a substrate support disposed in said chamber, said substrate support having an upper surface;
    a first edge ring disposed on said substrate support; and
    a second edge ring for mating engagement with said first edge ring, said second edge ring having a lip portion having an inner edge aligned with an edge of a substrate positioned on said upper surface to define a gap between said lip portion and said upper surface, such that the lip edge does not overlap a front surface of the substrate.

11. The apparatus of claim 10 wherein said first edge ring comprises a purge gas ring and said second edge ring comprises a shadow ring.

12. The apparatus of claim 10 further comprising a purge gas system coupled to said gap for transferring a purge gas through said gap and under said lip portion.

13. The apparatus of claim 10 wherein said lip portion has a generally flat inner edge that is adapted to match a substrate profile.

14. The apparatus of claim 10 wherein said lip portion extends over said upper surface a prescribed distance from an edge of said support, said distance between about 1.5 mm and about 3.0 mm.

15. A method for supporting a substrate in a chamber, said method comprising:

provideing an apparatus for processing substrates, said apparatus comprising;

a chamber;

a substrate support disposed in said chamber, said substrate support having an upper an edge ring disposed on said substrate support, said edge ring having a lip portion which at least partially overhangs said substrate support upper surface to define a gap between said lip portion and said upper surface;

positioning a substrate on said support, said substrate having an upper surface and an edge, an inner edge of the lip aligned with an edge of the substrate such that the lip edge does not overlap a front surface of the substrate; and flowing a purge gas into said gap between said lip portion and said support upper surface, said purge gas impinging upon said substrate edge.

16. The method of claim 15 wherein said lip portion has a generally flat inner edge that is adapted to match a generally flat portion of said substrate edge.

17. A. The method of claim 16 wherein said positioning said substrate further comprises aligning said generally flat portion of said substrate edge with said lip portion inner edge.

18. The method of claim 15 further comprising depositing a material on said substrate upper surface, said purge gas flowing to substantially prevent deposition of said material on said substrate edge.

19. The method of claim 15 wherein said positioning said substrate further comprises aligning a generally flat portion of said substrate edge with said lip portion.

* * * * *